(12) United States Patent
Hedrich et al.

(10) Patent No.: US 7,152,488 B2
(45) Date of Patent: Dec. 26, 2006

(54) SYSTEM OPERATING UNIT

(75) Inventors: Roland Hedrich, Ehringshausen (DE); Karsten Urban, Jena (DE); Joachim Wienecke, Jena (DE)

(73) Assignee: Leica Microsystems Semiconductor GmbH, Wetzlar (DE)

( * ) Notice: Subject to any disclaimer, the term of this patent is extended or adjusted under 35 U.S.C. 154(b) by 140 days.

(21) Appl. No.: 10/853,757

(22) Filed: May 26, 2004

(65) Prior Publication Data

US 2004/0244512 A1 Dec. 9, 2004

(30) Foreign Application Priority Data

Jun. 4, 2003 (DE) ................ 103 25 225

(51) Int. Cl.
*G01N 3/20* (2006.01)
(52) U.S. Cl. ...................................... 73/849
(58) Field of Classification Search .................. 73/849
See application file for complete search history.

(56) References Cited

U.S. PATENT DOCUMENTS

| 5,224,609 | A | * | 7/1993 | Bauer et al. ................. 211/65 |
| 5,738,316 | A | * | 4/1998 | Sweere et al. ......... 248/123.11 |
| 5,751,548 | A | * | 5/1998 | Hall et al. .................. 361/686 |
| 5,918,841 | A | * | 7/1999 | Sweere et al. ......... 248/123.11 |
| 6,233,139 | B1 | | 5/2001 | Hamon |
| 6,359,217 | B1 | * | 3/2002 | Thompson et al. ........... 174/50 |
| 6,378,830 | B1 | | 4/2002 | Lu |
| 6,401,863 | B1 | * | 6/2002 | Kirkland ..................... 182/142 |
| 6,478,274 | B1 | | 11/2002 | Oddsen, Jr. |
| 6,510,049 | B1 | | 1/2003 | Rosen |
| 6,520,727 | B1 | | 2/2003 | Babbs et al. |
| 2003/0052787 | A1 | * | 3/2003 | Zerhusen et al. ........ 340/573.1 |
| 2005/0024821 | A1 | * | 2/2005 | Arippol ...................... 361/686 |

FOREIGN PATENT DOCUMENTS

| JP | 8-66354 A | 3/1996 |
| JP | 2001-311498 A | 9/2001 |

* cited by examiner

*Primary Examiner*—Micheal Cygan
*Assistant Examiner*—Octavia Davis
(74) *Attorney, Agent, or Firm*—Foley & Lardner LLP

(57) ABSTRACT

The invention concerns a system operating unit (30) having a column (3) that is attachable by way of at least two supports (9, 10) to different points of a system housing (14). In the preferred embodiment, this column is attached laterally to the housing, the supports serving for attachment to the housing of the system. In addition, a retaining bracket (4) is connected to the column (3) in such a way that a horizontal deflection of the retaining bracket (4) about a vertical axis is possible.

18 Claims, 4 Drawing Sheets

SYSTEM OPERATING UNIT

CROSS REFERENCE TO RELATED APPLICATIONS

This application claims priority of the German patent application 103 25 225.8 which is incorporated by reference herein.

FIELD OF THE INVENTION

The invention concerns a system operating unit for inspection devices. The invention refers in particular to a variable attachable system operating unit that is used to control devices for wafer inspection.

BACKGROUND OF THE INVENTION

The systems used for wafer inspection often comprise an integrated monitor and an associated keyboard, which are integrated directly into the housing or can be pulled out of the housing using drawers. Clean rooms, in particular, are often dimensioned in terms of their area in such a way that an unfavorable arrangement of the monitor and keyboard can lead to operating problems.

U.S. Pat. No. 6,520,727 discloses an operating device in the form of a monitor that is attached to the frame of the apparatus by means of a retaining arm. The retaining arm is pivotably mounted so that a horizontal adjustment is possible, the monitor being connected to the retaining arm via a further joint.

U.S. Pat. No. 6,510,049 discloses a mount for a monitor that encompasses a foot which carries a rotatable plate, so that the display can be rotated in one dimension. Further axes with joints are arranged in such a way that the display can additionally be tilted and rotated. An adjustment of the display in three dimensions is thus possible. The foot is embodied so that wall installation can be performed.

U.S. Pat. No. 6,478,274 discloses a monitor holder that can be attached to a table or a similar panel. A vertical adjustment is accomplished by way of an arm that is assisted by a compression spring. A mount for attachment to a table is provided at one end of the arm, and a mount for attachment of the display is arranged at the other end of the arm.

U.S. Pat. No. 6,233,139 discloses a display holder that comprises a column retained by a foot. Attached to the column is a slide rail on which a display mount, assisted by a spring, is guided.

U.S. Pat. No. 6,378,830 discloses a display holder that comprises a foot on which a display attachment, movable in a horizontal and vertical direction, is arranged.

Japanese document JP 8-66354 discloses a U-shaped apparatus for retaining a display. The one limb of the U is connected in stationary fashion to a table, the other limb of the U receiving two displays. The limb connected to the table is rotatably mounted so that the displays can be adjusted in the horizontal plane. The span of the U can furthermore be varied in order to permit movement in the corresponding dimension.

Japanese document P 2001-311498A discloses a mount for a display that comprises a column which can be attached in stationary fashion, having an arm that is mounted rotatably on the column and receives a display holder that allows movements in further dimensions.

SUMMARY OF THE INVENTION

It is the object of the invention to make available a variable and ergonomic attachment system for monitoring and control units for various kinds of systems. In the preferred embodiment, the control units are made available for inspection systems such as those utilized in wafer production.

This object is achieved by a system operating unit, in particular for inspection devices. The system operating unit has a column that is attachable by way of at least two supports to different points of a system housing. A retaining bracket that is in working engagement with the column is provided in such a way that a horizontal deflection about a vertical axis is possible. At least one attachment is mounted rotatably about the retaining bracket for reception of an input means and an output means.

The object is achieved in particular by a system operating unit, in particular for inspection devices. The system has a column that is attachable by way of at least two supports to different points of a system housing. A retaining bracket is provided in working engagement with the column in such a way that a horizontal deflection about a vertical axis is possible. At least one attachment is mounted rotatably about the retaining bracket for reception of an input means and an output means. A deflection bracket is in working engagement with the rotatably attachment for the output means or the input means and the column, such that upon a deflection of the retaining bracket, a torque on and thus an adjustment of the output means or the input means is generated by the first deflection bracket.

It is particularly advantageous if the column, the supports, and the retaining bracket are embodied as cable conduits. The retaining bracket is U-shaped and is connected immovably to the column at two points. Each attachment provided on the retaining bracket comprises a bearing, and each deflection bracket possesses one respective end that is immovably connected to the column. A respective other end of each deflection bracket is connected to the corresponding attachment, which carries a respective input and/or output means.

Rotation of the retaining bracket makes possible an adjustment of the input and/or output means in at least one dimension. The input and output means is a monitor and/or a keyboard. The input and the output means can be configured in one device and this device can be a touch screen.

It is advantageous if the system unit is associated with a system housing. This refers, in particular, to system housings of devices for wafer inspection or for the inspection of semiconductor substrates. Provided on the system housing are two attachment points that are embodied in such a way that a variable arrangement of a system operating unit is possible.

The system housing possesses comprises at least a first and a second external surface, and the attachment points are provided on the system housing in such a way that the column is mounted in the region where the first and the second external surfaces meet.

A retaining bracket is built onto the column provided on the system housing. At least one rotatably mounted attachment, for the reception of at least one input and output means for controlling the system, is provided on the retaining bracket. A respective deflection bracket is mounted between the column and the rotatably mounted attachment in such a way that upon a deflection of the retaining bracket, the at least one input and output means is automatically adjustable with respect to the first and the second external surface.

One retaining bracket is connected to the column in such a way that a horizontal deflection of the retaining bracket about a vertical axis is possible. The deflection is achieved either in that the column is rotatably mounted or in that the retaining bracket is connected to the column via a rotary joint. In the preferred embodiment, however, the column rotates on bearings that are arranged between the supports and the column. In this embodiment, the supports adjoin the two ends of the column.

In a preferred embodiment, the retaining bracket is U-shaped, so that it is connected to the column at two points. At least one attachment for receiving an input and output means is arranged on the retaining bracket. In the preferred embodiment, there are two attachments, which receive on the one hand a keyboard and on the other hand a monitor. The attachments are embodied in such a way that the monitor can be inclined and tilted, and the keyboard can be arranged in accordance with the monitor adjustment. This is preferably achieved by way of a ball joint that is integrated into the attachment. Alternative joints are likewise conceivable. In a further possible embodiment, a touch screen can be used, so that the keyboard and monitor are integrated into one unit. With this application only one attachment is needed.

For use in clean rooms, it is advantageous if the cables that are used to connect the keyboard and monitor to the system are guided in cable conduits. To achieve this, the column is preferably embodied as a cable conduit that comprises a series of openings in order to direct the cables into the interior of the column. To achieve a positively fitting connection to the system housing, the supports are likewise equipped with a cable conduit, which is embodied in such a way that the cables can be guided through the column into the cable conduits of the supports, from which they are directed into the interior of the system housing.

In order to display the status of the system, lights are mounted as an extension of the column, their electrical supply leads preferably being guided through the cable conduit of the column.

A further constituent of the present invention is a system housing, in particular for an inspection device, which is embodied so as to make possible single-sided attachment of the above-described system operating unit at at least two points on the housing. In the preferred embodiment, corresponding orifices with threads and cable inlets are made available at two corners of the system housing. Also provided are plug connections which allow the end user to mount the operating unit in variable fashion with no need to accept functional limitations.

BRIEF DESCRIPTION OF THE DRAWINGS

The invention is explained below in more detail with reference to exemplary embodiments that are depicted schematically in the Figures. Identical reference numbers in the individual Figures designate identical elements. In the individual Figures.

DETAILED DESCRIPTION OF THE INVENTION

Numerous modifications and refinements of the exemplary embodiments described can be effected within the context of the invention.

Figure 1:
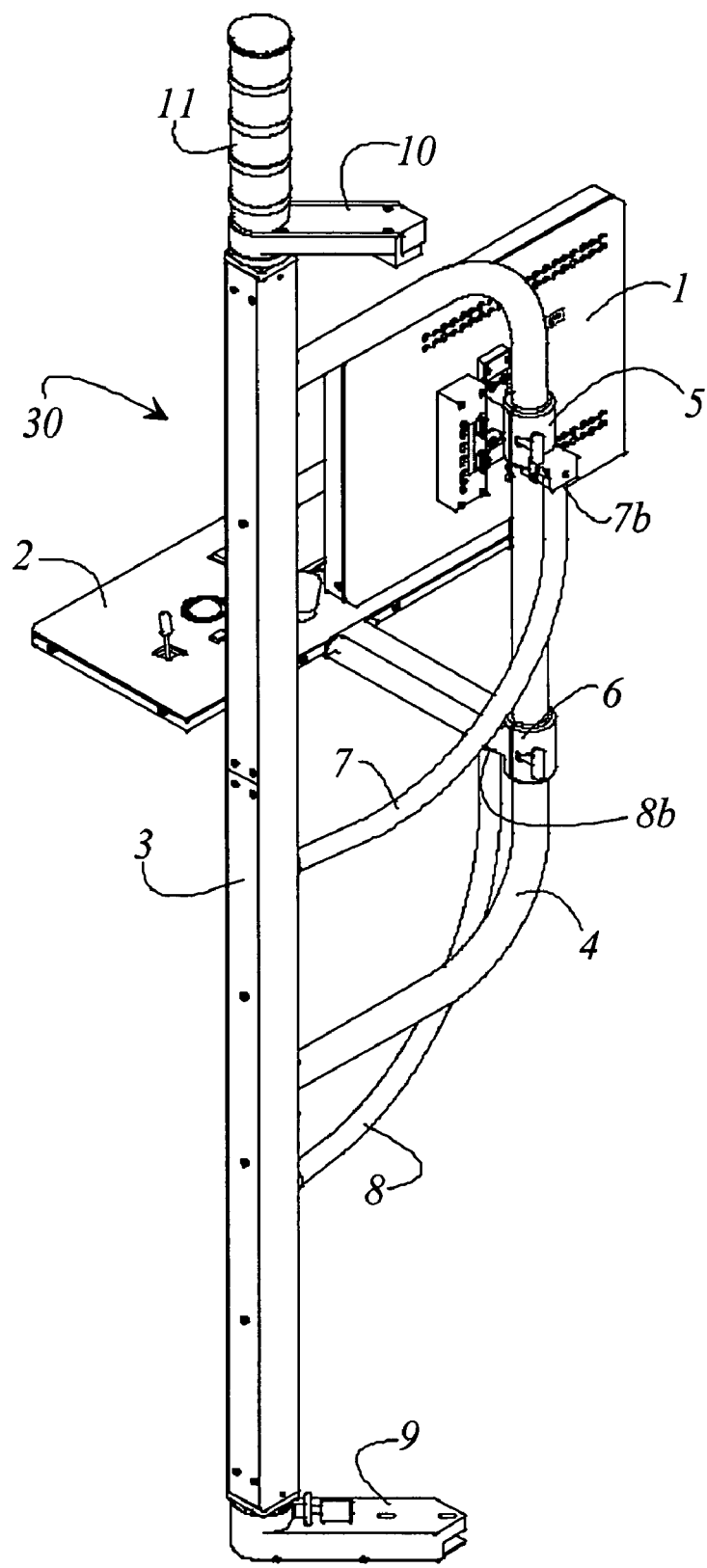
FIG. 1 is a perspective view of the back side of the system operating unit that is not attached to a system housing.
Figure 2:
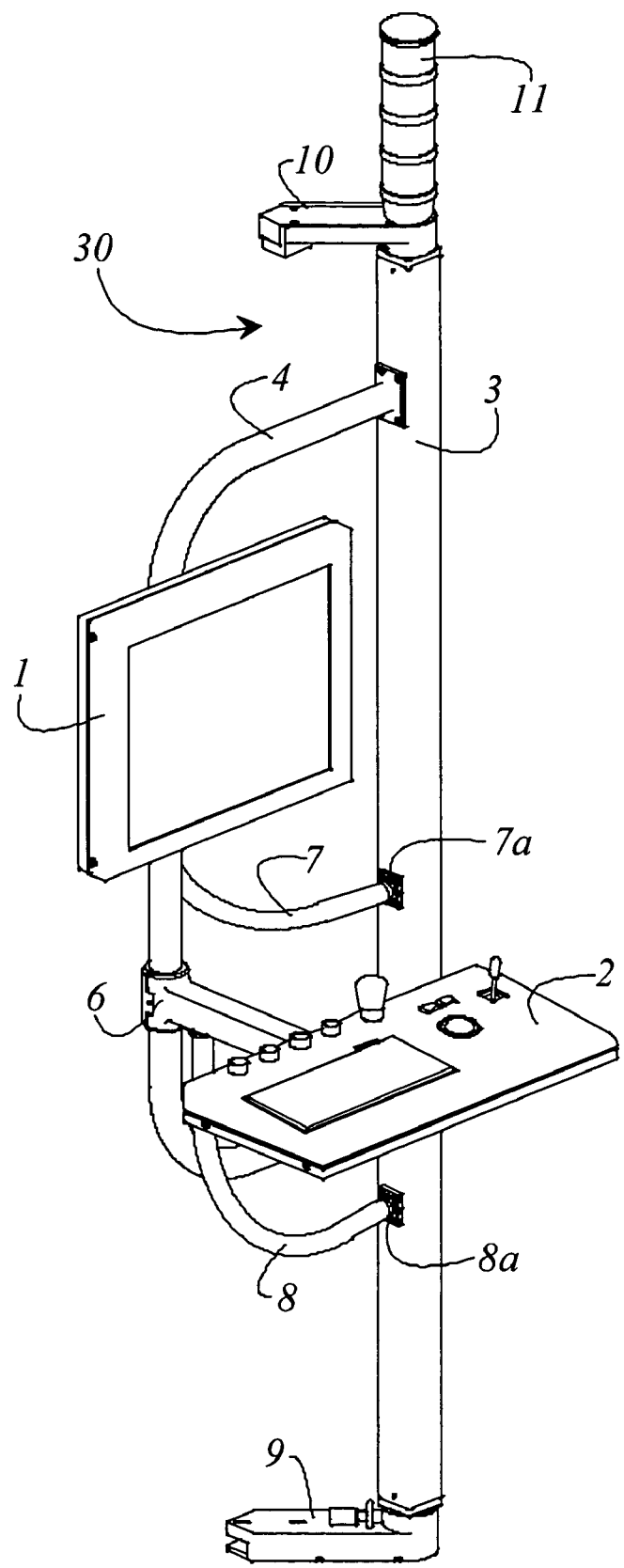
FIG. 2 is a perspective view of the front side of the system operating unit that is not attached to a system housing.

FIGS. 1 and 2 show the operating unit according to the present invention without a specific attachment to a system housing. A retaining bracket 4 that is U-shaped is attached to a column 3. The two ends of retaining bracket 4 are bolted to column 3. In an alternative embodiment, one or more joints can be arranged between the column and the bracket, allowing a deflection in the horizontal plane. The column is box-shaped and has one side that can be opened, thus allowing access to the cables that are routed inside the column. This embodiment makes it possible for column 3 to be used as a cable conduit 15.

Arranged at both ends of the column are joints that are connected on the one hand to the end region of column 3 and on the other hand to supports 9, 10.

Figure 3:
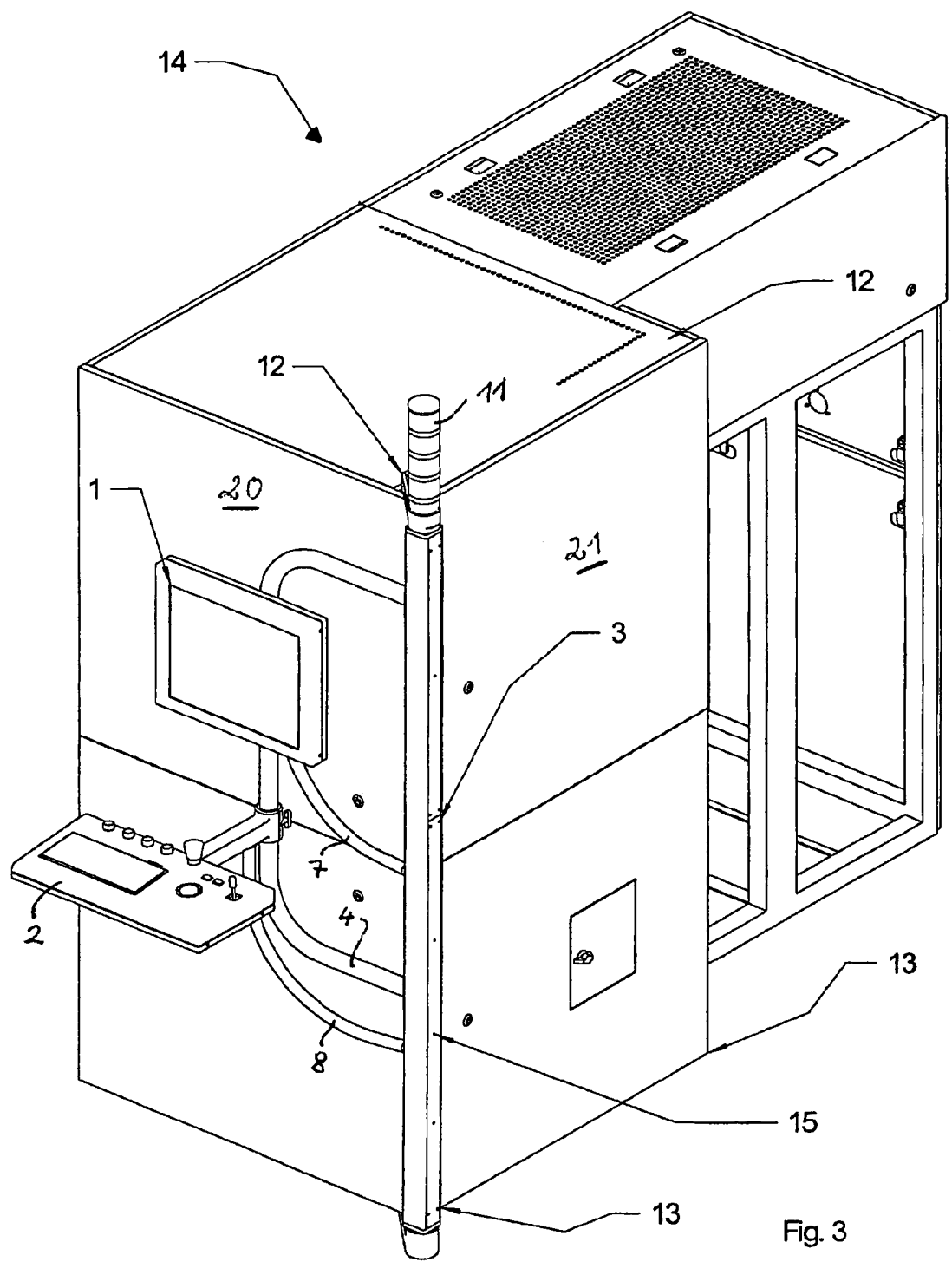
FIG. 3 is a perspective view of the system operating unit attached to a system housing.
Figure 4:
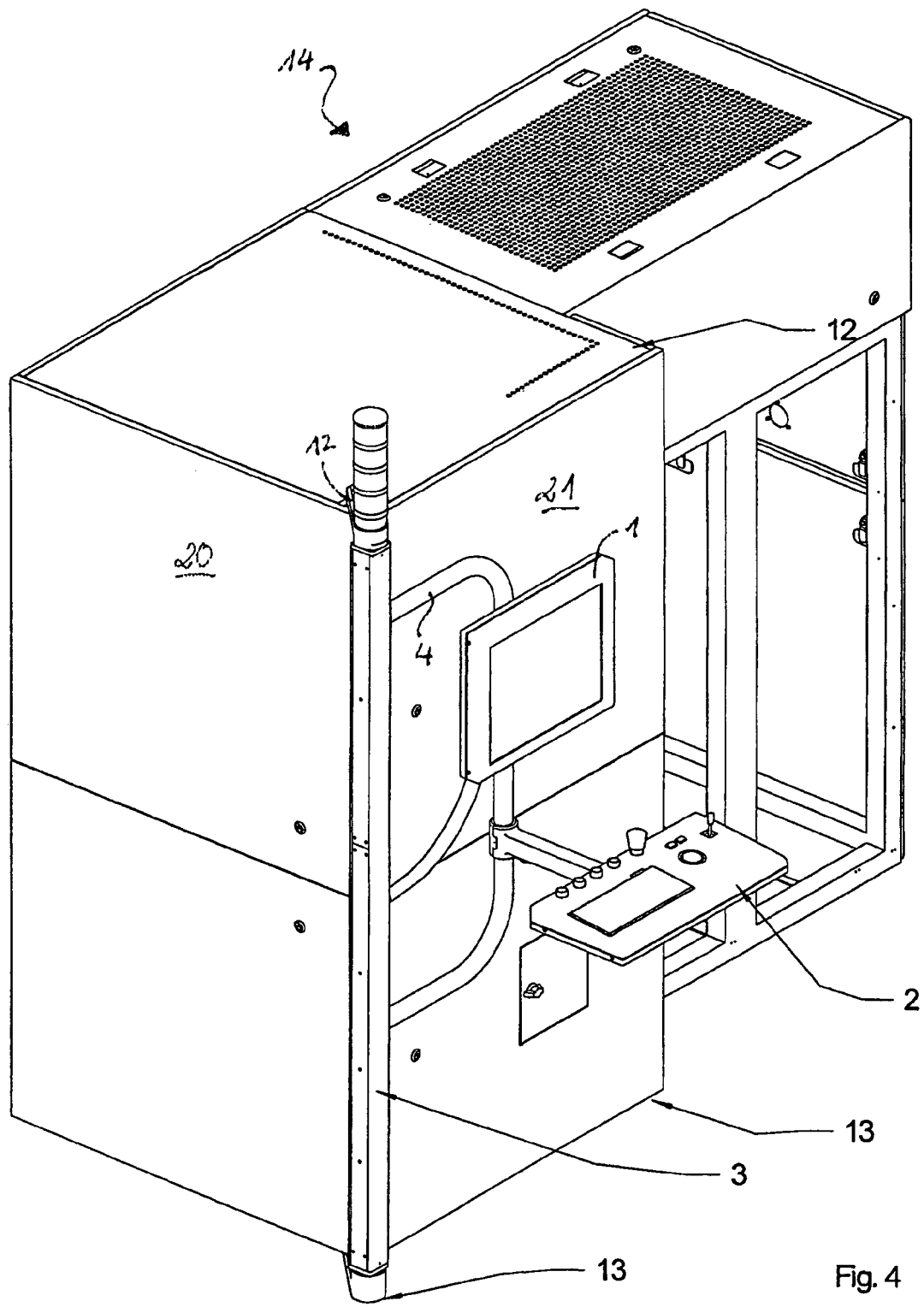
FIG. 4 is a perspective view of the system operating unit adjusted in an alternative manner.

Supports 9, 10 are embodied in such a way that they can be used for attachment to system housing 14, as is apparent from FIGS. 3 and 4. Corresponding orifices are provided for this in the floor and ceiling panels of system housing 14. Attachment points 12, 13 that are thus formed furthermore comprise orifices through which the cables can be directed into the interior of system housing 14.

In the exemplary embodiment depicted here, a monitor 1 and a keyboard 2, constituting an input and output means, are connected to column 3 via attachments 5, 6. In a preferred embodiment, these attachments 5, 6 also comprise joints or a bearing in order to allow an adjustment of monitor 1 or keyboard 2 in further dimensions. From attachments 5, 6, deflection brackets 7, 8 extend to column 3. Each of deflection brackets 7, 8 has a respective end 7a, 8a that is immovably connected to column 3. A respective other end 7b, 8b of each deflection bracket 7, 8 is connected to the corresponding attachment 5, 6, which respectively carries an input and/or output means 1, 2.

Additionally attached at the upper end of the column is a light 11 that, in the present case, comprises multiple segments that can represent, by different coloring, various operating states of the system that is to be operated.

FIGS. 3 and 4 each present a perspective view of system housing 14, input and output means 1, 2 being arranged in two different positions. The system operating unit that carries input and output means 1, 2 is connected to system housing 14 via at least two attachment points 12, 13. Attachment points 12, 13 are embodied in such a way that a variable arrangement of a system operating unit is possible.

System housing 14 possesses at least a first and a second external surface 20, 21, the arrangement of input and output means 1, 2 upon maximum pivoting with retaining bracket 4 being such that the input and output means are automatically adjustable with respect to the first and the second external surface. The attachment points 12, 13 are provided on the system housing in such a way that input and output means 1, 2 are parallel to the first or a second external surface 20, 21. Input and output means 1, 2 can be arranged directly in front of either the first or the second external surface 20, 21, so that a user standing in front of either the first or the second external surface 20, 21 can operate the system by way of input and output means 1, 2. Column 3 is installed in the region where first and second external surfaces 20, 21 meet.

As already mentioned, column 3 is provided at appropriate points on system housing 14. Retaining bracket 4 is, for example, bolted to column 3. At least one rotatably mounted attachment 5, 6, for reception of an input and output means 1, 2 for controlling the system, is provided on retaining bracket 4. Between column 3 and the rotatably mounted attachments 5, 6, a respective deflection bracket 7, 8 is mounted in such a way that upon a deflection of retaining bracket 4, input and output means 1, 2 can be adjusted accordingly with respect to the first and/or second external surface 20, 21 of system housing 14. It is self-evident that first and second external surfaces 20, 21 depicted here cannot be construed as a limitation. System operating unit 30 can be arranged on two different suitable external surfaces of the system housing.

What is claimed is:

1. A system operating unit, in particular for inspection devices, comprising:
    a column that is rotatably attachable by way of at least two supports to different points of a system housing, wherein the system housing comprises first and second external surfaces, wherein the column is installed in a region where the first and second external surfaces, meet and form a corner of the system housing, wherein an orifice with a cable inlet is provided at each support at the corner of the system housing;
    a retaining bracket that is in working engagement with the column in such a way that a horizontal deflection about a vertical axis is possible; and
    at least one attachment, mounted rotatably about the retaining bracket, for reception of an input unit and an output unit.

2. The system operating unit as defined in claim 1, wherein a second deflection bracket is in working engagement with the attachment for the input unit and the column, such that upon a deflection of the retaining bracket, a torque on and thus an adjustment of the input unit is generated by the second deflection bracket.

3. The system operating unit as defined in claim 1, wherein a first and a second deflection bracket are in working engagement with each attachment for the output unit and the input unit and the column, such that upon a deflection of the first and the second deflection bracket, a torque on and thus an adjustment of the output unit and the input unit is generated by the first deflection bracket and the second deflection bracket.

4. The system operating unit as defined in claim 1, wherein the column, the supports, and the retaining bracket are embodied as cable conduits.

5. The system operating unit as defined in claim 1, wherein at least one light source is provided.

6. The system operating unit as defined in claim 2, wherein each attachment provided on the retaining bracket comprises a bearing; and each deflection bracket comprises one respective end that is immovably connected to the column, and one respective other end of each deflection bracket is connected to the corresponding attachment, which carries a respective input and/or output unit.

7. The system operating unit as defined in claim 6, wherein rotation of the retaining bracket makes possible an adjustment of the input and/or output unit in at least one dimension.

8. The system operating unit as defined in claim 1, wherein the input unit is a keyboard and output unit is a monitor.

9. The system operating unit as defined in claim 1, wherein the input unit and the output unit are configured as a touch screen.

10. The system operating unit as defined in claim 5, wherein the at least one light source is arranged as an extension of the column.

11. The system operating unit as defined in claim 1, wherein the at least two supports are provided at opposite ends of the column.

12. The system operating unit as defined in claim 1, wherein the column is attached to a top end and bottom end of the corner of the system housing.

13. The system operating unit as defined in claim 1, wherein the retaining bracket is arranged to pivot a maximum amount such that a horizontal axis of the input unit and output unit are parallel with respect to the first and second external surfaces.

14. A system operating unit, in particular for inspection devices, comprising:
    a column that is rotatably attachable by way of at least two supports to different points of a system housing, wherein the system housing comprises first and second external surfaces, wherein the column is installed in a region where the first and second external surfaces meet and form a corner of the system housing, wherein an orifice with a cable inlet is provided at each support at the corner of the system housing;
    a retaining bracket that is in working engagement with the column in such a way that a horizontal deflection about a vertical axis is possible;
    at least one attachment, mounted rotatably about the retaining bracket, for reception of an input unit and an output unit;
    a deflection bracket that is in working engagement with the attachment for the output unit or the input unit and the column, such that upon a deflection of the retaining bracket, a torque on and thus an adjustment of the output unit or the input unit is generated by the deflection bracket.

15. A system operating unit, in particular for inspection devices, comprising:
    a column that is rotatably attachable by way of at least two supports to different points of a system housing, wherein the system housing comprises first and second external surfaces, wherein the column is installed in a region where the first and second external surfaces meet and form a corner of the system housing, wherein an orifice with a cable inlet is provided at each support at the corner of the system housing;
    a retaining bracket that is in working engagement with the column in such a way that a horizontal deflection about a vertical axis is possible;
    at least one attachment, mounted rotatably about the retaining bracket, for reception of an input unit and an output unit;
    a first deflection bracket that is in working engagement with the attachment for the output unit and a second deflection bracket that is in working engagement with the attachment for the input unit and the column, such that upon a deflection of the retaining bracket, a torque on and thus an adjustment of the output unit and the input unit is generated by the first and the second deflection bracket, respectively.

16. A system housing for an inspection device, comprising at least two attachment points that are embodied such that a variable arrangement of a system operating unit is possible wherein the system operating unit has a column that is rotatably attachable by way of at least two supports to different points of the system housing, wherein the system housing comprises first and second external surfaces, wherein the column is installed in a region where the first and second external surfaces meet and form a corner of the system housing, wherein an orifice with a cable inlet is provided at each support at the corner of the system housing; a retaining bracket that is in working engagement with the column in such a way that a horizontal deflection about a vertical axis is possible; and at least one attachment, mounted rotatably about the retaining bracket, for reception of an input unit and an output unit.

17. The system housing as defined in claim 16, wherein a retaining bracket is built onto the column; and at least one rotatably mounted attachment, for the reception of an input and output unit for controlling the system, is provided on the retaining bracket; and a respective deflection bracket is mounted between the column and the rotatably mounted attachment in such a way that upon a deflection of the retaining bracket, the input and output units are automatically adjustable with respect to the first and the second external surface.

18. The system housing as defined in claim 17, wherein regardless of the deflection of the retaining bracket, an adjustment of the input and output units in the direction of a user is always possible.

* * * * *